United States Patent
Muellauer et al.

(10) Patent No.: US 10,924,108 B2
(45) Date of Patent: Feb. 16, 2021

(54) CIRCUIT ARRANGEMENT WITH GALVANIC ISOLATION BETWEEN ELECTRONIC CIRCUITS

(71) Applicant: Infineon Technologies Austria AG, Villach (AT)

(72) Inventors: Markus Muellauer, Faak am See (AT); Thomas Ferianz, Bodensdorf (AT); Hermann Gruber, Woerth a. D. (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/786,882

(22) Filed: Feb. 10, 2020

(65) Prior Publication Data
US 2020/0266817 A1   Aug. 20, 2020

(30) Foreign Application Priority Data
Feb. 14, 2019   (DE) .................... 10 2019 103 730.1

(51) Int. Cl.
*H03K 17/691*   (2006.01)
*H03K 17/567*   (2006.01)

(52) U.S. Cl.
CPC ......... *H03K 17/691* (2013.01); *H03K 17/567* (2013.01)

(58) Field of Classification Search
CPC .......... H03K 17/691; H03K 17/567; H01L 23/5222; H01L 23/48; H01L 23/5223

USPC .................................. 327/108–112; 257/503
See application file for complete search history.

(56) References Cited

U.S. PATENT DOCUMENTS

| | | | |
|---|---|---|---|
| 9,299,655 B2 * | 3/2016 | Moghe | .............. H01L 23/48 |
| 2016/0163692 A1 | 6/2016 | Moghe et al. | |
| 2020/0168631 A1 * | 5/2020 | Gibson | ........... H01L 23/5223 |

FOREIGN PATENT DOCUMENTS

WO   2014/036594 A1   3/2014

* cited by examiner

*Primary Examiner* — Tomi Skibinski
(74) *Attorney, Agent, or Firm* — Harrity & Harrity, LLP (57) ABSTRACT

A circuit arrangement is enclosed. The circuit arrangement includes a first electronic circuit; a second electronic circuit; and a coupling circuit connected between the first electronic circuit and the second electronic circuit. The first electronic circuit is at least partially integrated in a first region of a semiconductor layer, the second electronic circuit is at least partially integrated in a second region of the semiconductor layer, and the second region adjoins a first insulating layer formed on a first surface of the semiconductor layer and is electrically insulated from the first region by a second insulating layer. Further, the coupling circuit is arranged in a third insulating layer formed on a second surface of the semiconductor layer and comprises at least two capacitors connected in series.

20 Claims, 11 Drawing Sheets

CIRCUIT ARRANGEMENT WITH GALVANIC ISOLATION BETWEEN ELECTRONIC CIRCUITS

CROSS REFERENCE TO RELATED APPLICATION

This application claims priority to German Patent Application No. 102019103730.1 filed on Feb. 14, 2019, the content of which is incorporated by reference herein in its entirety.

TECHNICAL FIELD

This disclosure, in general, relates to a circuit arrangement with galvanic isolation between a first electronic circuit and a second electronic circuit such as a first electronic circuit and a second electronic circuit in a drive circuit for driving a transistor device.

BACKGROUND

A transistor device, such as a MOSFET (Metal Oxide Semiconductor Field-Effect Transistor) or an IGBT (Insulated Gate Bipolar Transistor), is a voltage controlled device that switches on or off dependent on a drive signal received at a drive input. The signal can be a drive voltage and the drive input can be formed by a control node and a first load node of the transistor device. In a MOSFET, for example, the control node is formed by a gate node and the first load node is formed by a source node of the MOSFET. In an IGBT, the control node is formed by a gate node and the first load node is formed by an emitter node.

A drive circuit for driving a transistor device can be configured to receive an input signal and generate the drive signal at a drive output dependent on the input signal. The input signal can be a voltage signal that is referenced to a first reference potential (that may also be referred to as first ground potential). In many circuit applications, the transistor device is connected such that the second load node is connected to a circuit node that has a potential that is different from the first reference potential. In these cases, the drive voltage is referenced to a potential different from the first reference potential. In a high-side configuration, for example, the first load node of the transistor device is connected to a circuit node having an electrical potential that may swing between a first potential and a second supply potential dependent on a switching state (on or off) of the transistor device. In high voltage applications, for example, the electrical potential at the first load node of the transistor device may vary between about 0V and several 100V.

The input signal, for example, is a low voltage signal generated by a control circuit such as a microcontroller. In order to protect the control circuit from high potentials that may occur at the drive output, the drive circuit may include a galvanic isolation between the drive input and the drive output.

SUMMARY

It is desirable to provide a circuit arrangement with a galvanic isolation between a first electronic circuit and a second electronic circuit that is small, can be produced in cost efficient manner, and can be tested in a reliable fashion.

One example relates to a circuit arrangement. The circuit arrangement includes a first electronic circuit, a second electronic circuit, and a coupling circuit connected between the first electronic circuit and the second electronic circuit. The first electronic circuit is at least partially integrated in a first region of a semiconductor layer, the second electronic circuit is at least partially integrated in a second region of the semiconductor layer, and the second region adjoins a first insulating layer formed on a first surface of the semiconductor layer and is electrically insulated from the first region by a second insulating layer. Further, the coupling circuit is arranged in a third insulating layer formed on a second surface of the semiconductor layer and comprises at least two capacitors connected in series.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the implementation may be used and implemented. It is to be understood that the features of the various implementations described herein may be combined with each other, unless specifically noted otherwise.

Figure 1:
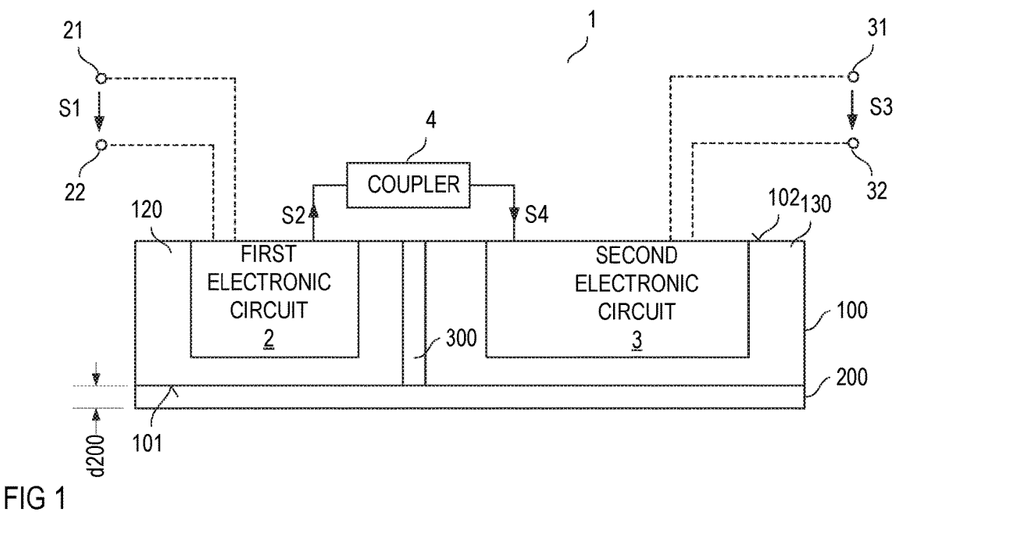
FIG. 1 illustrates a circuit arrangement with a first electronic circuit, a coupling circuit, and a second electronic circuit according to one example.

FIG. 1 shows one example of a circuit arrangement 1 with a galvanic isolation between a first electronic circuit 2 and a second electronic circuit 3. and a coupling circuit 4 connected between the first electronic circuit 2 and the second electronic circuit 3. The first electronic circuit 2 is at least partially integrated in a first region 120 of a semiconductor layer 100, and the second electronic circuit 3 is at least partially integrated in a second region 130 of the semiconductor layer 100. Both the first electronic circuit 2 and the second electronic circuit 3 are schematically illustrated as circuit blocks in the example shown in FIG. 1. These circuits 2, 3 can be implemented as integrated circuits in the first and second regions 120, 130 of the semiconductor layer 100 using integrated circuit technologies. Thus, the first electronic circuit 2 may also be referred to as first integrated circuit and the second electronic circuit 3 may also be referred to as second integrated circuit.

According to one example, the first electronic circuit 2 is connected to a first port 21, 22 (illustrated in dashed lines in FIG. 1) and the second electronic circuit 3 is connected to a second port 31, 32 (illustrated in dashed lines in FIG. 1). Each of the first port 21, 22 and the second port 31, 32 may have a first node 21, 31 and a second node 22, 32.

The first electronic circuit 2 may receive a first signal S1 at the first port 21, 22 transmit a signal that is dependent on the first signal S1 via the coupling circuit 4 to the second electronic circuit 3, and the second electronic circuit 3 may output a second signal S3 at the second port 31, 32, wherein the second signal S3 is dependent on a signal received from the first electronic circuit 2 via the coupling circuit 4. In this example, the first electronic circuit 2 acts an interface circuit, the first signal S1 is an input signal, the second electronic circuit 3 acts as an output circuit, and the second signal S3 is an output signal.

Alternatively, the second electronic circuit 3 may receive the second signal S3 at the second port 31, 32 transmit a signal that is dependent on the second signal S3 via the coupling circuit 4 to the first electronic circuit 2, and the first electronic circuit 2 may output the first signal S1 at the first port 21, 22, wherein the first signal S1 is dependent on a signal received from the second electronic circuit 3 via the coupling circuit 4. In this example, the second electronic circuit 3 acts an interface circuit, the second signal S3 is an input signal, the first electronic circuit 2 acts as an output circuit, and first signal S1 is an output signal.

The circuit arrangement may be configured to perform (a) a unidirectional communication between the first port 21, 22 and the second port 31, 32 or (b) a bidirectional communication between the first port 21, 22 and the second port 31, 32. In the first case (a), one of the first electronic circuit 2, 3 is an interface circuit and the other one of the first and second electronic circuit 2, 3 is an output circuit. In the second case (b), each of the first electronic circuit 2 and the second electronic circuit 3 is an interface and output circuit. At one time, one of the first electronic circuit 2 and second electronic circuit 3 operates as interface circuit and receives an input signal from the respective first or second port 21, 22 or 31, 32 it is connected thereto and the other one of the first electronic circuit 2 and the second electronic circuit 3 operates as output circuit and outputs a signal at the respective first or second port 21, 22 or 31, 32 it is connected thereto.

Referring to FIG. 1, the second region 130 adjoins a first insulating layer 200 that is formed on a first surface 101 of the semiconductor layer 100. Optionally, the circuit arrangement 1 includes at least one further layer (not shown in FIG. 1) below the insulating layer 200. That is, the insulating layer 200 may be formed on at least one further layer. The at least one further layer may include an electrically insulating layer, a semiconducting layer, or a conducting layer. According to one example, the at least one further layer includes only one layer. According to another example, the at least one further layer includes a layer stack with two or more layers, wherein adjacent layers include different materials.

Further, the second region 130 is electrically insulated from the first region 120 by a second insulating layer 300. In this circuit arrangement 1, a voltage blocking capability of the first insulating layer 200 may be lower than a voltage blocking capability of the second insulating layer 300 which is a vertical structure and lower than a voltage blocking capability of the coupling circuit 4. This is explained in detail herein further below.

According to one example, the first insulation layer 200 not only adjoins the second region 130 of the semiconductor layer 100, but covers the complete first surface 101 of the semiconductor layer 100, so that it also adjoins the first region 120 of the semiconductor layer 100. According to one example, the semiconductor layer 100 is a monocrystalline semiconductor layer comprising at least one of monocrystalline silicon (Si), silicon carbide (SiC), gallium arsenide (GaAs), or gallium nitride (GaN). According to another example, the semiconductor layer is a composite layer comprising two or more layers of different monocrystalline semiconductor materials.

Referring to the above, the second insulating layer 300 electrically insulates the first region 120 from the second region 130 of the semiconductor layer 100. A signal communication between the interface circuit 2 integrated in the first region 120 and the output circuit 3 integrated in the second region 130 is provided by the coupling circuit 4. This coupling circuit 4 is configured to transmit information from the interface circuit 2 across the isolation barrier provided by the second insulating layer 300 to the output circuit 3. Referring to the above, the circuit arrangement 1 may generate the second signal S3 at the second port 31, 32 based on the first signal S1 received at the first port 21, 22. In this example, the first electronic circuit 2 receives the first signal S1 and maps information included in the first signal S1 to an interface circuit output signal S2, the coupling circuit 4 receives the interface circuit output signal S2 and generates a coupling circuit output signal S4. The coupling circuit output signal S4 includes the information included in the interface circuit output signal S2 and, therefore, the information included in the first signal S1. The second electronic circuit 3 receives the coupling circuit output signal S4 and generates the second signal S3 based on the coupling circuit output signal S4, that includes the information included in the first signal S1, so that the second signal S2 is generated based on the first signal S1.

According to one example, the circuit arrangement 1 is configured to drive a transistor device that receives the second signal S3 at a drive input. In this example, the second signal S3 may also be referred to as drive signal. Examples of a transistor device are explained herein further below. For driving a transistor device, the first signal S1 may include a switching information, wherein the switching information defines time instances at which it is desired to switch on or switch off the transistor device. Based on the switching information included in the first signal S1, which is an input signal in this example, the second electronic circuit 3 generates the second signal (drive signal) S3 such that it either has an on-level configured to switch on the transistor device or an off-level configured to switch off the transistor device.

FIG. 1 illustrates a section of the semiconductor layer 100 that includes the first and second regions 120, 130, and a section of the second insulating layer 300 arranged between the first and second regions 120, 130. Referring to FIG. 1, the second insulating layer 300 may extend completely through the semiconductor layer 100 in a vertical direction z from the first surface 101 to a second surface 102 opposite the first surface 101. The "vertical direction z" of the semiconductor layer is a direction perpendicular to the first surface 101 and the second surface 102.

The voltage blocking capability of the overall circuit arrangement 1 is essentially defined by the voltage blocking capability (dielectric strength) of the first insulating layer 200. The first insulating layer 200 may be arranged on an electrically conducting carrier that is connected to the lowest electrical potential, such as ground, occurring in the circuit arrangement during operation. Thus, the first insulating layer 200 may break through when a voltage between any circuit node in the circuit arrangement, such as any one of the port nodes 21, 22, 31, 32, and the lowest potential becomes higher than the voltage blocking of the first insulating layer 200. The voltage blocking capability of the first insulating layer 200 can be adjusted more precisely than the voltage blocking capability of the coupling circuit 4 or the voltage blocking capability of the second insulating layer 300. Referring to the above, the voltage blocking capability of the second insulating layer 200, when implemented using a given material, is essentially dependent on a thickness d200 of the first insulating layer 200. According to one example, the first insulating layer 200 can be produced such that its thickness d200 deviates less than about 0.2 micrometers from a desired thickness and the desired thickness is greater than 8 micrometers. In this case, the produced thickness deviates less than 2.5% from the desired thickness, so that the voltage blocking capability deviates less than 2.5% from the desired voltage blocking capability that is associated with the desired thickness. According to one example, forming the first insulating layer 200 includes depositing the first insulating layer on the semiconductor layer 100.

Manufacturing the coupling circuit 4 and/or the second insulating layer 300 may include more complex manufacturing sequences than manufacturing the first insulating layer 200. Due to this, the voltage blocking capabilities of the coupling circuit 4 and/or the second insulating layer 300 cannot be adjusted as precisely as the voltage blocking capability of the first insulating layer 200. According to one example, deviations in the manufacturing processes may cause the voltage blocking capability of the coupling circuit 4 and/or the second insulating layer 300 to deviate more than 20% or more than 30% from a desired voltage blocking capability.

The voltage blocking capability of the circuit arrangement is a useful feature during operation of the circuit arrangement, but also when it comes to testing. It may be desirable for a circuit arrangement to break down almost exactly at a predefined voltage blocking capability. In a circuit arrangement of the type explained above this may be obtained by implementing the first insulating layer 200 (the voltage blocking capability of which can be precisely adjusted) with a voltage blocking capability that is lower than the voltage blocking capability of each of the coupling circuit 4 and the second insulating layer 300.

According to one example, the first insulating layer 200 is implemented such that the voltage blocking capability is greater than 600V, greater than 800V, or greater than 1200V.

Figure 2:
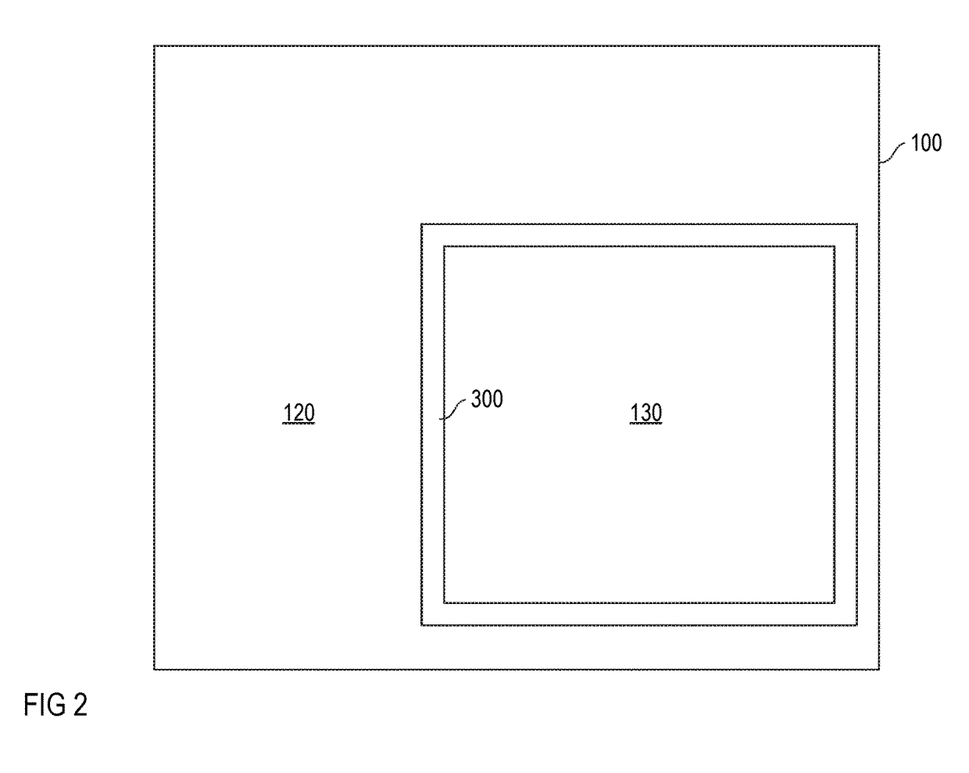
FIG. 2 schematically illustrates a top view of a semiconductor layer in which the first electronic circuit and the second electronic circuit are integrated.

Referring to FIG. 2, which shows a top view of the second surface 102 of the semiconductor layer 100, the second insulating layer 300 can have the form of a ring and completely surround the second region 130 in horizontal directions of the semiconductor layer 100. "Horizontal directions" are directions parallel to the first and second surface 101, 102. Just for the purpose of illustration, the ring formed by the second insulating layer 300 is a rectangular ring in the example illustrated in FIG. 2. This, however, is just an example. Any other type of ring such as, for example, a circular ring, an elliptical ring, or a polygonal ring may be implemented as well. According to a further example (not shown), the second insulating layer 300 insulates the first region 120 from the second region 130 in that the second insulating layer 300 surrounds the first region 120 in lateral directions.

Figure 3A:
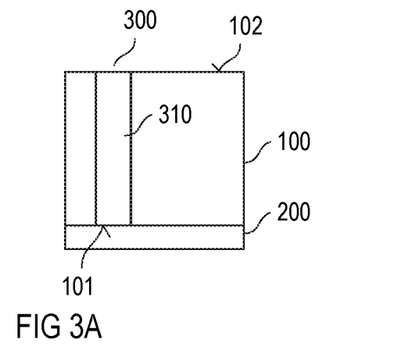
FIGS. 3A to 3C illustrate different examples of a second insulating layer arranged in the semiconductor layer between a first region and a second region.
Figure 3B:
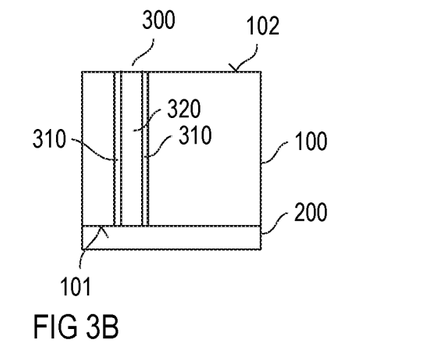
Figure 3C:
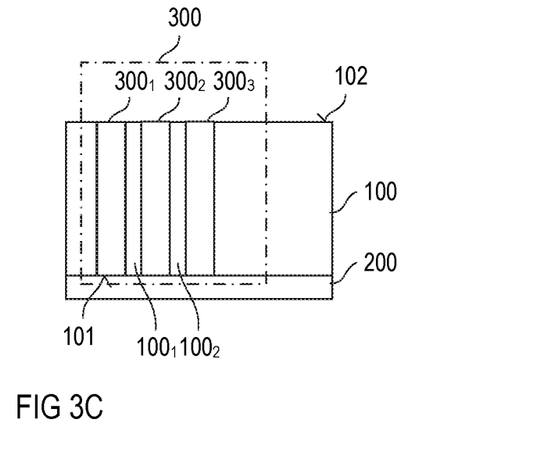

FIGS. 3A to 3C illustrate examples of the second insulating layer 300 in greater detail. Each of these FIGS. 3A to 3C shows a vertical cross-sectional view of one section of the insulating layer 300.

According to one example illustrated in FIG. 3A, the insulating layer 300 is completely comprised of an electrically insulating material 310. Examples of the insulating material 310 include but are not restricted to, a semiconductor oxide or a nitride. According to one example, the semiconductor layer 100 is a monocrystalline silicon layer or a monocrystalline silicon carbide layer. In this example, the insulating material 310 may be comprised of silicone dioxide ($SiO_2$).

According to another example illustrated in FIG. 3B, the second insulating layer 300 includes an electrically conducting core 320 electrically insulated from the semiconductor layer 100 by insulating layers 310. These insulating layers 310 can include one or more of the materials explained with reference to the insulating layer 310 illustrated in FIG. 3A. According to one example, the electrically conducting core 320 includes a polycrystalline semiconductor material such as, for example, polysilicon.

Forming a second insulating layer 300 of the type shown in FIG. 3A may include forming a trench in the semiconductor layer 100 and filling the trench with the electrically insulating material 310. Forming a second insulating layer 300 of the type shown in FIG. 3B may include forming a trench in the semiconductor layer 100, forming the insulating material 310 on sidewalls of the trenches, for example, by a thermal oxidation process, and filling a residual trench that remains after forming the insulating material 310 by the electrically conducting material, wherein the electrically conducting material forms the core 320.

According to another example illustrated in FIG. 3C, the second insulating layer 300 includes a plurality of insulating sub-layers $300_1$-$300_3$ that are spaced apart from each other in a horizontal direction (a direction perpendicular to the first and second surface 101, 102) and separated from each other by sections $100_1$, $100_2$ of the semiconductor layer 100. Each of the sub-layers $300_1$-$300_3$ can be implemented in accordance with one of the examples explained with reference to FIGS. 3A and 3B. According to one example, the sub-layers $300_1$-$300_2$ are of the same type. According to another example, one or more of these sub-layers is implemented according to FIG. 3A and at least one other of the sub-layers $300_1$-$300_3$ is implemented in accordance with FIG. 3B. Just for the purpose of illustration, the second insulating layer 300 illustrated in FIG. 3C includes three sub-layers $300_1$-$300_3$. This, however, is only an example. Dependent on the desired voltage blocking capability of the second insulating layer 300 the number of sub-layers $300_1$-$300_3$ can be selected arbitrarily.

The voltage blocking capability (which may also be referred to as dielectric strength) of the second insulating layer 300 is essentially dependent on the type of material of the insulating material 310 and its overall thickness in the shortest distance between the first region 120 and the second region 130. Essentially, the voltage blocking capability is given by the dielectric strength of the insulating material 310 multiplied with its overall thickness in the shortest direction between the first region 120 and the second region 130. The "overall thickness" is either the thickness of one layer, if there is only one layer, or the sum of the thicknesses of several layers, if there are several layers. The dielectric strength of silicon dioxide ($SiO_2$), for example, is 2 MVcm.

Figure 4:
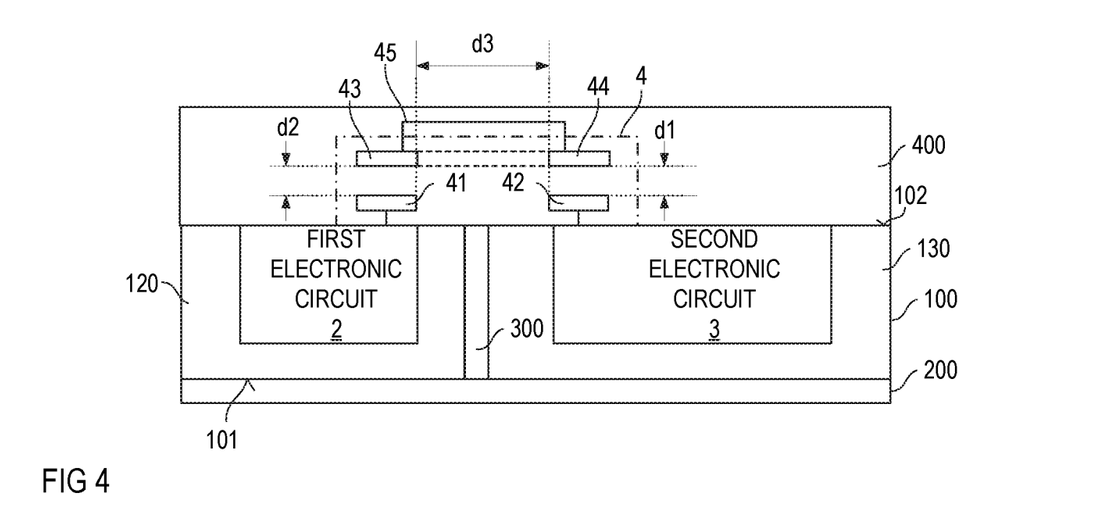
FIG. 4 illustrates one example of the coupling circuit.

According to one example, the coupling circuit 4 capacitively couples the first electronic circuit 2 integrated in the first region 120 with the second electronic circuit 3 integrated in the second region 130. One example of how the coupling circuit 4 may be implemented is illustrated in FIG. 4. A circuit diagram of the coupling circuit 4 shown in FIG. 4 is illustrated in FIG. 5.

Figure 5:
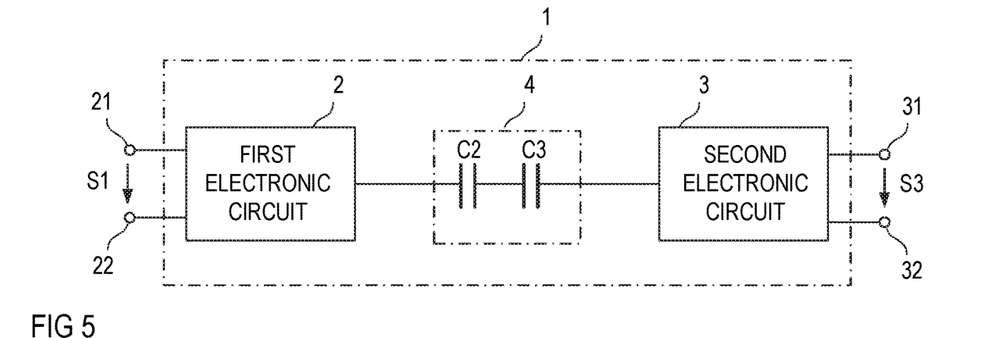
FIG. 5 shows a circuit diagram of the circuit arrangement shown in FIG. 4.

Referring to FIG. 5, the coupling circuit 4 shown in FIG. 4 includes a series circuit with two capacitors, a first capacitor C2 connected to the first electronic circuit 2, and a second capacitor C3 connected to the second electronic circuit 3. Referring to FIG. 4, these two capacitors C2, C3 are formed by a first capacitor plate 41 connected to the first electronic circuit 2, a second capacitor plate 42 connected to the second electronic circuit 3, a third capacitor plate 43 spaced apart from the first capacitor plate 41 and capacitively coupled with the first capacitor plate 41, and a fourth capacitor plate spaced apart from the second capacitor plate 42 and capacitively coupled with the second capacitor plate 42. The four capacitor plates 41-44 are arranged in a third insulating layer 400 formed on top of the second surface 102 of the semiconductor layer 100, wherein the first capacitor plate 41 connected to the first electronic circuit 2 may be arranged above the first region 120 and the second capacitor plate 42 connected to the second electronic circuit 3 may be arranged above the second region 130.

This third insulating layer 400 forms a capacitor dielectric in those regions where the insulating layer 400 is arranged between the first capacitor plate 41 and the third capacitor plate 43 and between the second capacitor plate 42 and the fourth capacitor plate 44. In FIG. 4, d1 denotes a distance between the first capacitor plate 41 and the third capacitor plate 43 in the vertical direction of the third insulating layer 400, which is a direction perpendicular to the second surface 102 of the semiconductor layer 100. Further, d2 denotes a distance between the second capacitor plate 42 and the fourth capacitor plate 43. The distance between the first capacitor plate 41 and the third capacitor plate 43 is also referred to as first distance d1 and the distance between the second capacitor plate 42 and the fourth capacitor plate 44 is also referred to as second distance d2 in the following. A third distance d3 is a distance between the first capacitor plate 41 and the second capacitor plate 42 in a horizontal direction of the third insulating layer 400, which is a direction parallel to the second surface 102 of the semiconductor layer 100.

Referring to FIG. 4, the third capacitor plate 43 and the fourth capacitor plate 44 are arranged at a greater distance to the semiconductor layer 100 than the first capacitor plate 41 and the second capacitor plate 42. Further, the third capacitor plate 43 and the fourth capacitor plate 44 are electrically connected, wherein an electrical connection 45 between these capacitor plates 43, 44 is only schematically illustrated in FIG. 4. This connection 45, can be implemented using any type of wiring arrangement inside the third insulating layer 400.

According to another example (illustrated in dashed lines in FIG. 4), the third capacitor plate 43, the fourth capacitor plate 44, and the connection between these capacitor plates 43, 44 are formed by a single capacitor plate that extends from above the first capacitor plate 41 to above the second capacitor plate 42.

The voltage blocking capability of the coupling circuit 4 illustrated in FIG. 4 is dependent on a dielectric strength of the material of the third insulating layer 400 and on the distances d1, d2, d3 between the capacitor plates 41, 42, 43. According to one example, the third distance d3 is greater than the first distance d1 plus the second distance d2, d3>d1+d2. In this case, the voltage blocking capability is essentially given by the dielectric strength of the material of the third insulating layer 400 multiplied with the sum of the first distance d1 and the second distance d2. According to one example, the third insulating layer 400, at least between the capacitor plates 41, 42, 43, includes an undoped silicate glass (USG).

The implementation of the coupling circuit 4 shown in FIGS. 4 and 5 in which the coupling circuit 4 includes one capacitor series circuit with two capacitors C2, C3 is only an example. Via a series circuit of capacitors of the type shown in FIG. 5, one pulsed signal can be transmitted. According to another example, the coupling circuit 4 includes several series circuits each including two capacitors and connected between the first electronic circuit 2 and the second electronic circuit 3. Using two of these series circuits a differential signal can be transmitted, for example.

Figure 6:
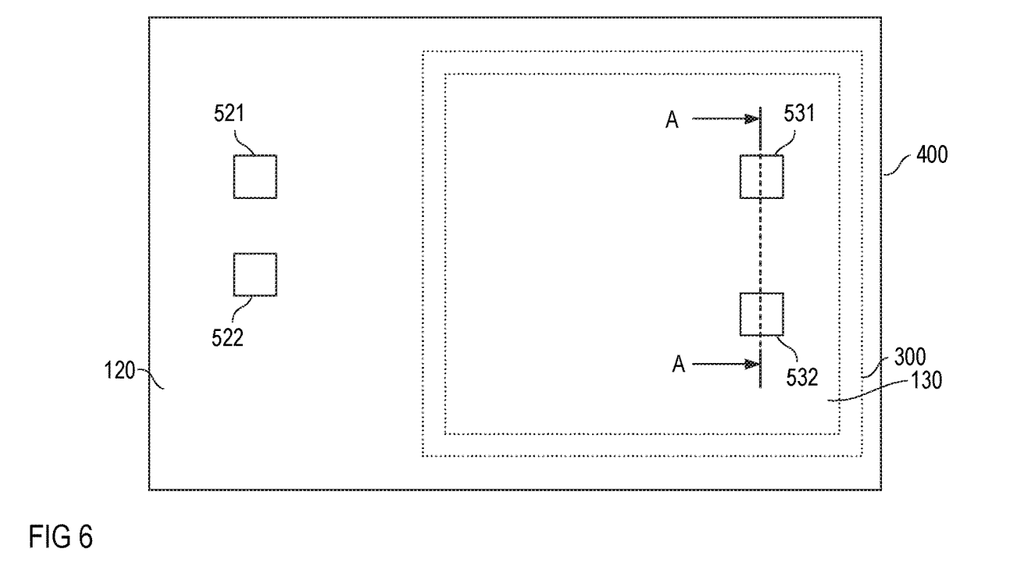
FIG. 6 shows a top of view of an insulating layer that, according to one example, is formed on top of the semiconductor layer and includes contact pads.

FIG. 6 shows a top-view of the third insulation layer 4 according to one example. In this example, contact pads 521, 522 are accessible at a first surface 401 of the third insulation layer 400 above the first region 120, and contact pads 531, 532 are accessible at the first surface 401 above the second region 130. According to one example, the contact pads 521, 522 above the first region 120 form the nodes 21, 22 of the first port, or are part of these port nodes 21, 22 of the electronic circuit arrangement 1. Equivalently, the contact pads 531, 532 above the second region 130 form the nodes 31, 32 of the second port or are part of these port nodes 31, 32.

Figure 7:
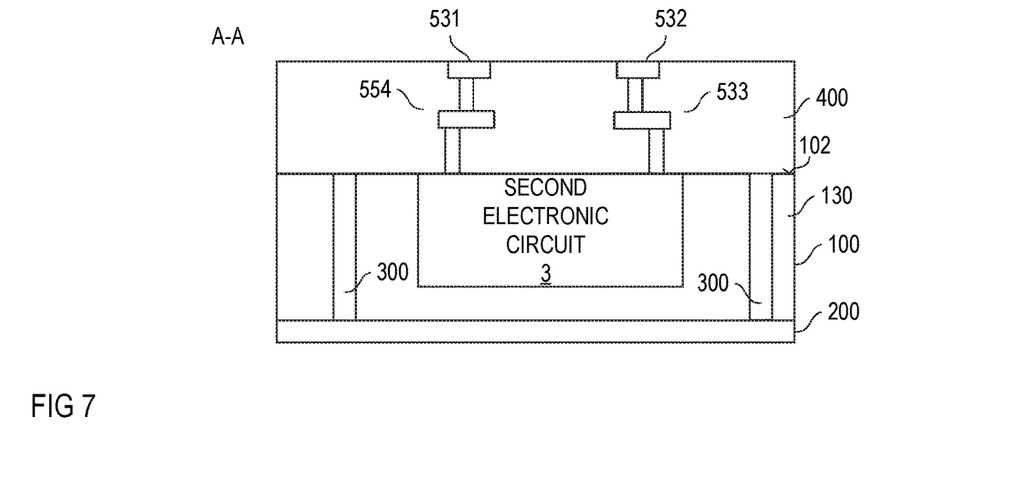
FIG. 7 shows a vertical cross sectional view of one section of the insulating layer shown in FIG. 6.

FIG. 7 shows a vertical cross-sectional view of the semiconductor layer 100 and the third insulating layer 400 in a section plane A-A cutting through the contact pads 531, 532 above the second region 130. Referring to FIG. 7, the contact pads 531, 532 are electrically connected to the second electronic circuit 3 integrated in the second region 130 through electrically conducting vias 533, 534 in the third insulating layer 400. The contact pads 521, 522 above the first region 120 can be connected to the first electronic circuit 2 in an equivalent way using electrically conducting vias extending from the contact pads 521, 522 through the third insulating layer 400 down to the first electronic circuit 2 integrated in the first region 120.

Figure 8:
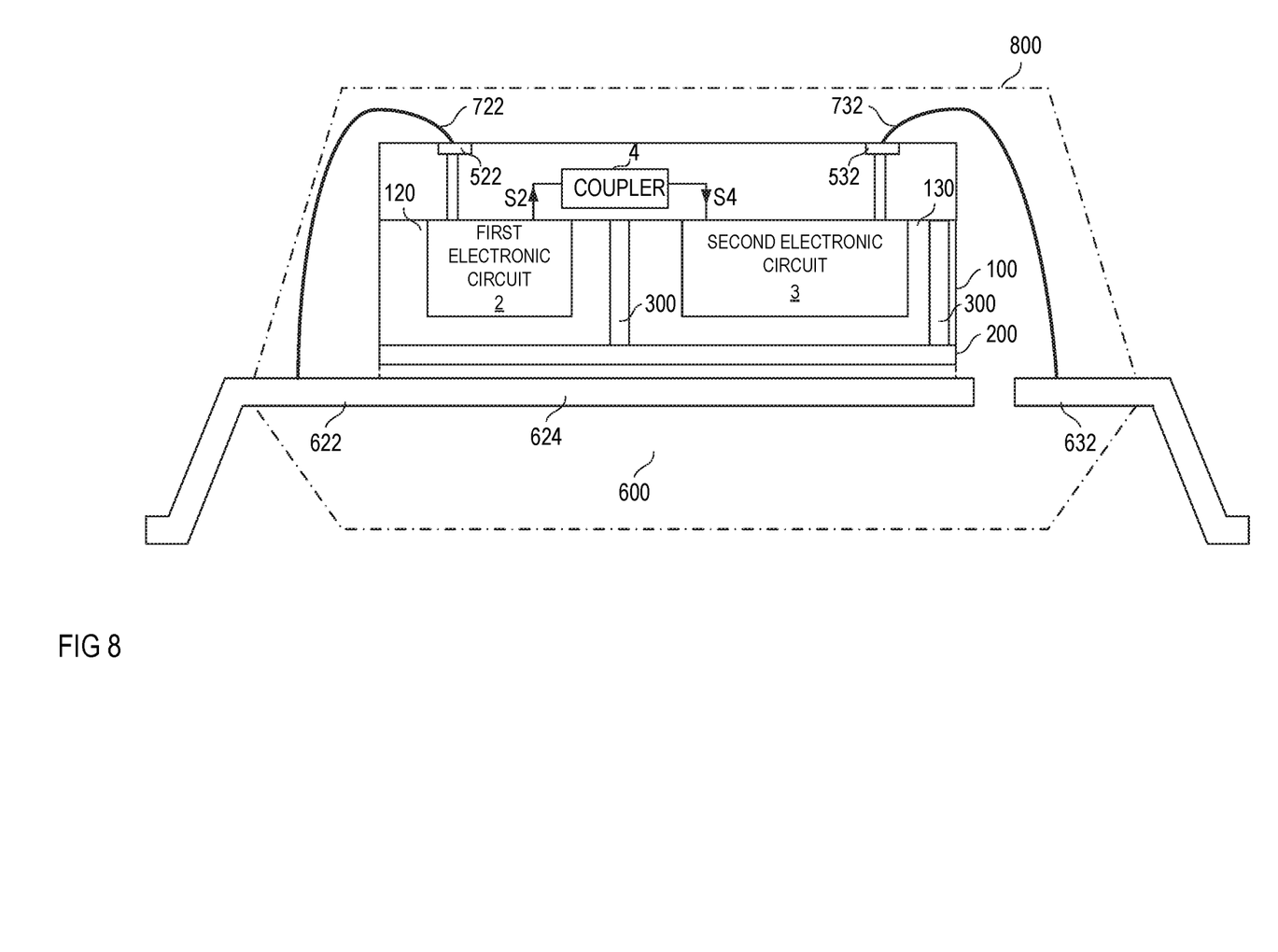
FIG. 8 shows a vertical cross sectional view of a semiconductor package that includes a circuit arrangement of the type shown in FIG. 1.

According to one example, the circuit arrangement includes a housing (package) in which the semiconductor arrangement with the semiconductor layer 100, and the first, second and third insulating layers 200, 300, 400 is arranged. One example of a circuit arrangement including a housing is illustrated in FIG. 8. FIG. 8 shows a vertical cross-sectional view of the housing 800 and the semiconductor arrangement encapsulated by the housing 800. The housing 800, which is illustrated in dashed and dotted lines in FIG. 8, may include a molding compound based on an epoxy resin. Referring to FIG. 8, the circuit arrangement further includes legs 622, 632 protruding from the housing 800 and electrically connected to contact pads on the surface 401 of the third insulating layer 400. These contact pads, from which the second contact pad 522 above the first region 120 and the second contact pad 532 above the second region 130 are illustrated, are electrically connected to a respective leg via bond wires 722, 732. The use of bond wires, however, is only an example. According to another example, flat conductors (not shown) or the like are used to connect the contact pads 522, 532 to the respective legs 622, 632. According to one example, the semiconductor arrangement with the semiconductor layer 100 is mounted on an electrically conducting carrier 624, wherein one of the legs 622 can be an integral part of this carrier 624. According to one example, the second input node 22 is formed by the leg 622 connected to the carrier 624 and connected to the first contact pad 522. The further leg 632 is separated from the carrier 624 and, electrically insulated from the carrier 624 by the material of the housing 800.

The circuit arrangement includes at least two further legs that are insulated from each other and from the legs 622, 632 shown in FIG. 8. These legs, however, are out of view in FIG. 8. One of these further legs is connected to the first contact pad 521 above the first region 120 and forms the first input node 21, and the other one of these further legs is connected to the first contact pad 531 above the second region 130 and forms the first output node 31.

Figure 9:
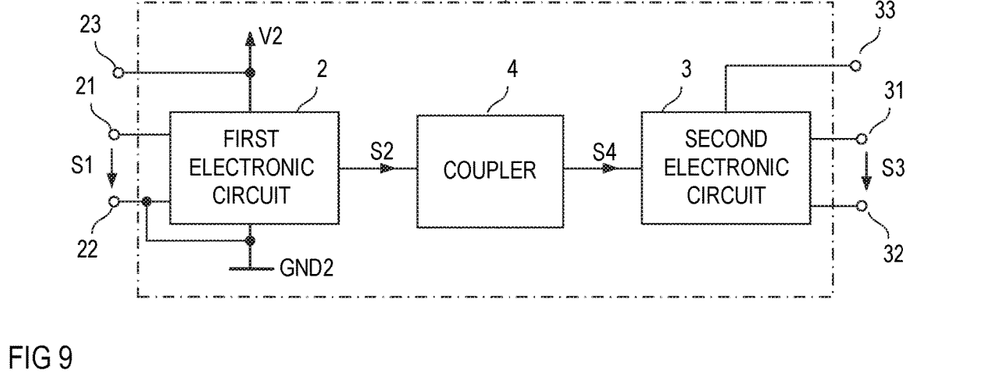
FIG. 9 illustrates a modification of the circuit arrangement shown in FIG. 1.

FIG. 9 shows a circuit diagram of a modification of the circuit arrangement explained hereinbefore. In this example, the circuit arrangement 1 includes a supply node 23, wherein the circuit arrangement 1 is configured to receive a supply voltage V2 at this supply node 23. More specifically, the supply voltage V2 is a voltage between the supply node 23 and the second port node 22, for example. Further, in this example, the second electronic circuit 3 includes a further supply node 33 configured to receive a supply voltage.

Figure 10:
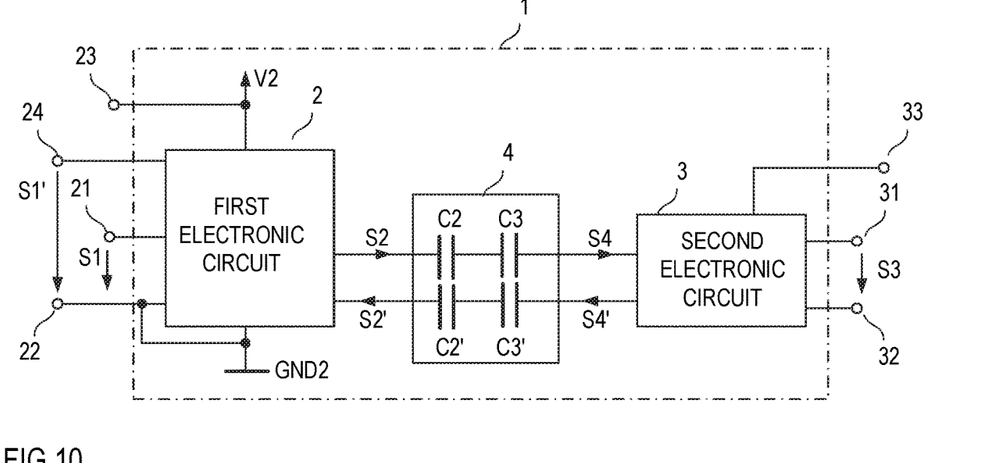
FIG. 10 illustrates another modification of the circuit arrangement shown in FIG. 1.

FIG. 10 shows a circuit diagram of a further modification of the circuit arrangement shown in FIG. 1. In the example illustrated in FIG. 10, the coupling circuit 4 is configured to provide for a bidirectional signal communication between the first electronic circuit 2 and the second electronic circuit 3. For this, the coupling circuit 4 includes the capacitor series circuit C2, C3 explained with reference to FIGS. 4 and 5 and at least one further capacitor series circuit C2', C3'. This further capacitor series circuit can be implemented in the same way as the capacitor series circuit C2, C3 explained with reference to FIGS. 4 and 5. The further capacitor series circuit C2', C3' is configured to receive a signal S4' from the second electronic circuit and provide a signal S2' based on the signal S4' received from the second electronic circuit 3 to the first electronic circuit 2. The first electronic circuit 3 is configured to provide an output signal S1' at a further node 24 based on this signal S2' received from the coupling circuit 4. According to one example, the output signal S1' is a voltage between the further node 24 and the second port node 22. The latter may also be referred to as reference node or ground node.

Figure 11:
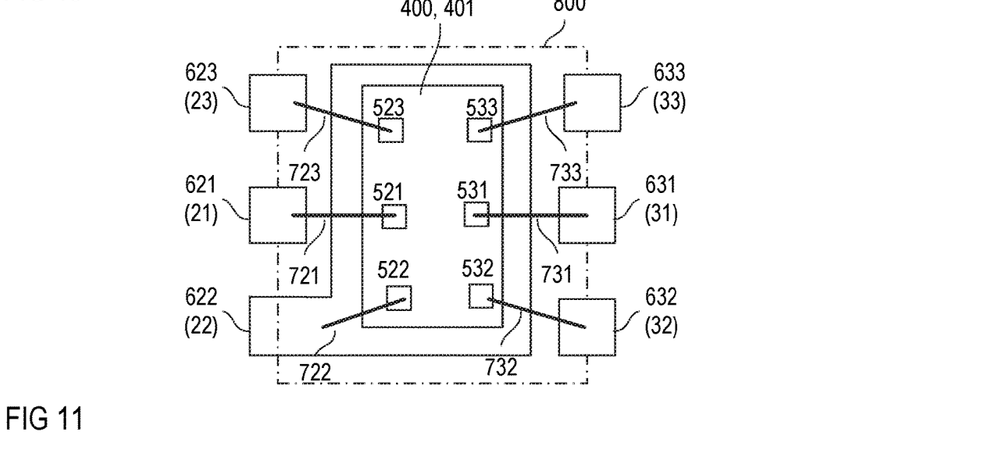
FIG. 11 shows a top view of a semiconductor package that includes a circuit arrangement of the type shown in FIG. 9.

FIG. 11 shows a top view of a circuit arrangement of the type shown in FIG. 8 and including two first port nodes 21, 22, supply node 23, two second port nodes 31, 32, and a further supply node 33. Each of these first port, second port and supply nodes 21-23, 31-33 is formed by one leg 621-623, 631-633 protruding from the housing 800. Each of these legs 621-633 is connected to a respective contact pad 521-533 at the first surface 401 of the third insulation layer 400 by a respective bond wire 721-733 (as shown), a flat conductor (not shown) or the like. Four contact pads 521, 522, 531, 532 of these contact pads are the contact pads explained with reference to FIG. 6, one 523 of these contact pads, together with the respective leg 623 and bond wire 723, forms the supply node 23, and another one 533 of these contact pads, together with the respective leg 633 and bond wire 733, forms the further supply node 33. In FIG. 11, the reference numbers of the first port, second port and supply nodes of the circuit arrangement that are formed by the respective legs 621-632 are indicated in brackets next to the reference number of the legs.

Of course, the circuit arrangement shown in FIG. 11 can be modified to include more than three nodes 21-23 connected to the first electronic circuit 2 and more than three nodes 31-33 connected to the second electronic circuit 3. This, however, is not illustrated in FIG. 11.

Figure 12:
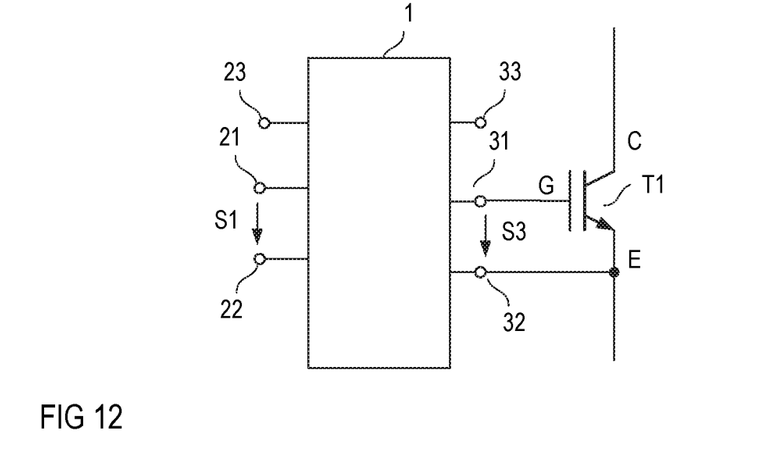
FIG. 12 illustrates using the circuit arrangement for driving a transistor device.

According to one example, the circuit arrangement 1 is configured to drive a transistor device. This is illustrated in FIG. 12, wherein the circuit arrangement is only represented by a circuit block in this figure. In this example, the second port 31, 32 is an output of the circuit arrangement so that the nodes 31, 32 of the second port can be referred to as first and second output nodes 31, 32 of the circuit arrangement 1. These first and second output nodes are connected to a drive input of the transistor device T1 in the example shown in FIG. 12. Just for the purpose of illustration, the transistor device T1 is an IGBT (Insulated Gate Bipolar Transistor) in this example. The drive input of this IGBT T1 is formed by a gate node G and an emitter node E. Implementing the transistor device T1 is an IGBT is only an example. According to further examples (not illustrated) the transistor device is a MOSFET (Metal Oxide Semiconductor Field Effect Transistor), a Bipolar Junction Transistor (BJT), or the like.

The transistor device T1 shown in FIG. 12 is a voltage controlled device that switches on or off dependent on a signal level of the second signal (drive signal) S3 received at the drive input G-E. According to one example, the transistor device T1 switches on when a signal level of the drive signal SDRV is higher than a threshold level of the transistor device T1, and switches off when the signal level of the drive signal S3 is below the threshold level. The circuit arrangement 1 generates the drive signal S3 based on the first signal (input signal) Si in the way explained herein before.

Figure 13A:
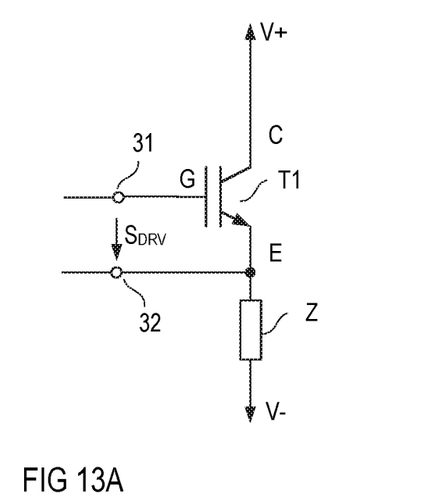
FIGS. 13A and 13B illustrate use of a transistor device as a high-side switch and a low-side switch, respectively.
Figure 13B:
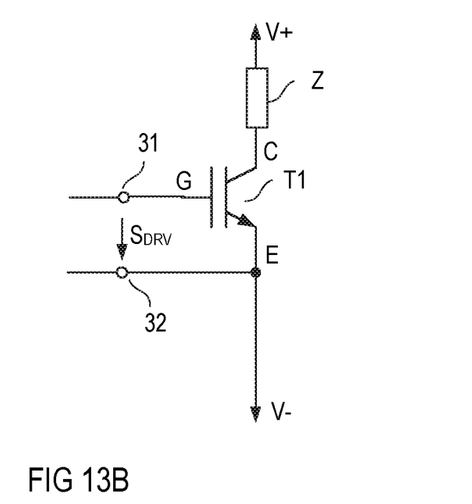

The transistor device T1 can be used as an electronic switch connected in series with a load. The transistor device T1 and the load can be connected with each other in one of several different configurations. Two examples are illustrated in FIGS. 13A and 13B, wherein each of these figures only shows the transistor device T1 and the load Z, the circuit arrangement 1 is not illustrated. In the example illustrated in FIG. 13A, the transistor device T1 is a high-side switch. In this case, the transistor device T1 is connected between the load Z and a first supply node where a positive supply potential V+ is available. A circuit node of the load Z facing away from the transistor device T1 is connected to a circuit node where a negative supply potential V− or ground potential is available. FIG. 13B shows an example in which the transistor device T1 is a low-side switch. In this example, the transistor device T1 is connected between the load Z and the negative supply potential V−. In each of these examples, a load path of the transistor device T1 is connected in series with the load Z. In case of a IGBT, as shown in FIGS. 13A and 13B, the load path is a collector-emitter path, which is an internal circuit path between a collector node C and the emitter node E of the IGBT.

The load Z is only schematically illustrated in FIGS. 13A and 13B. This load can be any type of inductive, resistive or capacitive load. The load Z can even be an electronic circuit with a plurality of circuit elements. According to yet another example, the load Z is another transistor device forming a half-bridge with the transistor device T1 shown in FIGS. 13A and 13B.

Figure 14:
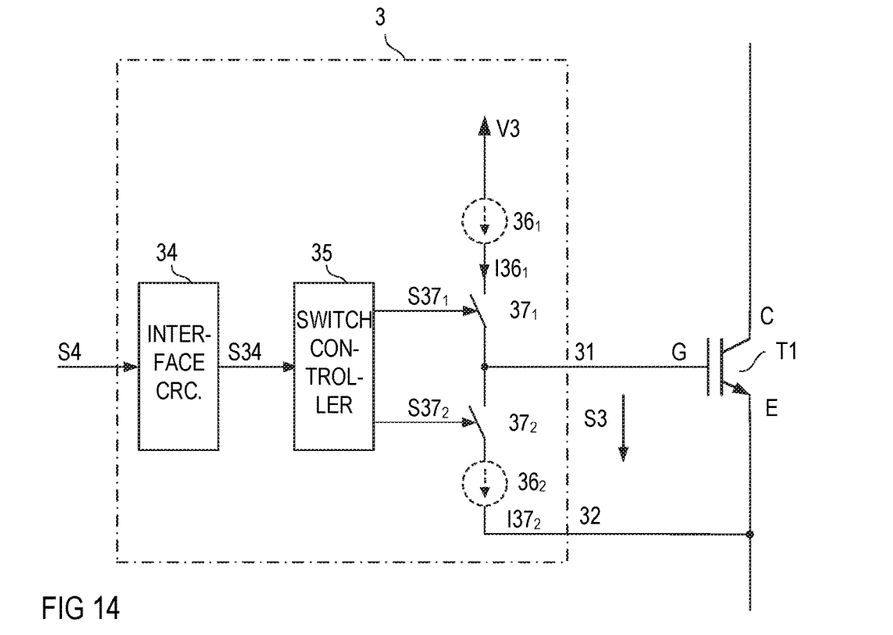
FIG. 14 shows one example of the second electronic circuit.

FIG. 14 illustrates one example of a second electronic circuit 3 configured to generate the drive signal S3 based on the coupling circuit output signal S4. In this example, the second electronic circuit 3 includes an interface circuit 34. This interface circuit 34 is configured to receive the coupling circuit output signal S4 and to generate a control signal S34 based on this coupling circuit output signal S4. The control signal S34 represents the first signal (input signal) S1 received by the circuit arrangement and, therefore, includes an information on whether to switch on or switch off the transistor device T1. According to one example, this control signal S34 has one of an on-level and off-level, wherein the on-level is a signal level indicating that it is desired to switch on the transistor device T1, and the off-level is a signal level indicating that it is desired to switch off the transistor device T1.

Referring to FIG. 14, a driver generates the drive signal S3 based on this control signal S34. In the example shown in FIG. 14, the driver includes a first switch $37_1$ connected between a circuit node where a driver supply voltage V3 is available and the first output node 31. A second switch $37_2$ is connected between the first output node 31 and the second output node 32. A switch controller 35 drives the first switch $37_1$ and the second switch $37_2$ dependent on the control signal S34. When the control signal S34 indicates that it is desired to switch on the transistor device T1, the switch controller 35 switches on the first electronic switch $37_1$ and switches off the second electronic switch $37_2$. In this case, an internal capacitance (not shown in the drawings) connected between the gate node G and the emitter node E of the transistor device T1 is charged, wherein the transistor device T1 switches on when a voltage across this capacitance reaches the threshold voltage of the transistor device T1. Optionally, a first current source $36_1$ is connected in series with the first switch $37_1$. This optional current source $36_1$ defines a current $I36_1$ flowing into the capacitance when the first switch $37_1$ is in the on-state and, therefore, defines the switching speed of the transistor device T1. When the control signal S34 indicates that it is desired to switch off the transistor device T1, the switch controller 35 switches off the first switch $37_1$ and switches on the second switch $37_2$. In this case, the internal capacitance is discharged so that the transistor device T1 switches off. Optionally, a second current source $36_2$ is connected in series with the second electronic switch $37_2$.

Figure 15:
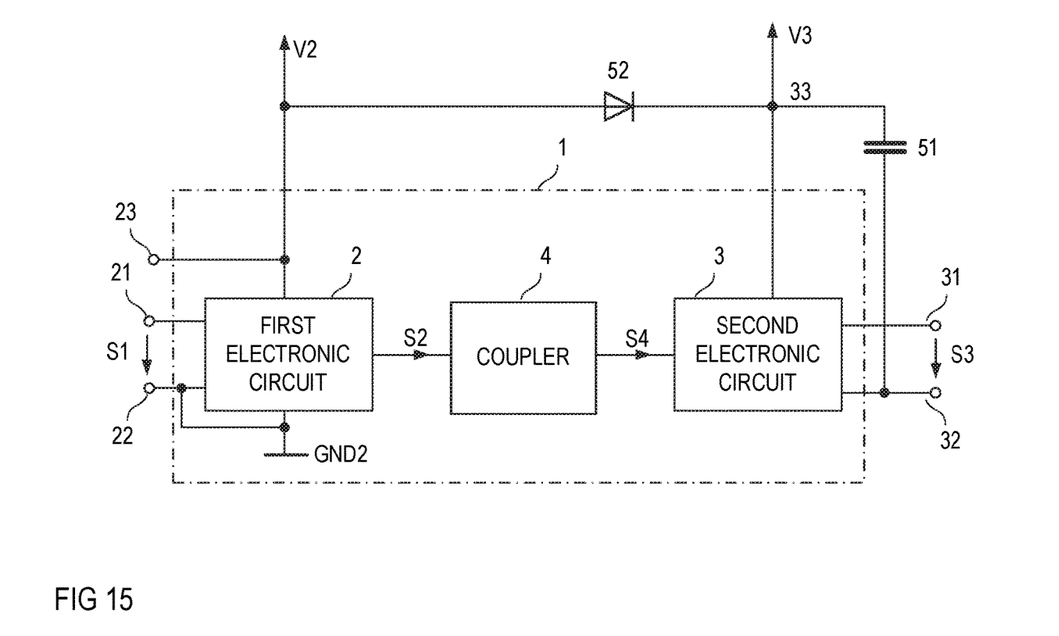
FIG. 15 shows one example of a supply circuit configured to generate a supply voltage received by the second electronic circuit.

FIG. 15 illustrates one example of an external circuit that can be used to generate the driver supply voltage V3 received by the second electronic circuit. In this example, the external circuit is a bootstrap circuit that includes a capacitor 51 connected between the supply node 33 of the second electronic circuit 3 and the second output node 32, and a diode 52 connected between the supply node 23 of the first electronic circuit 2 and the capacitor.

Figure 16:
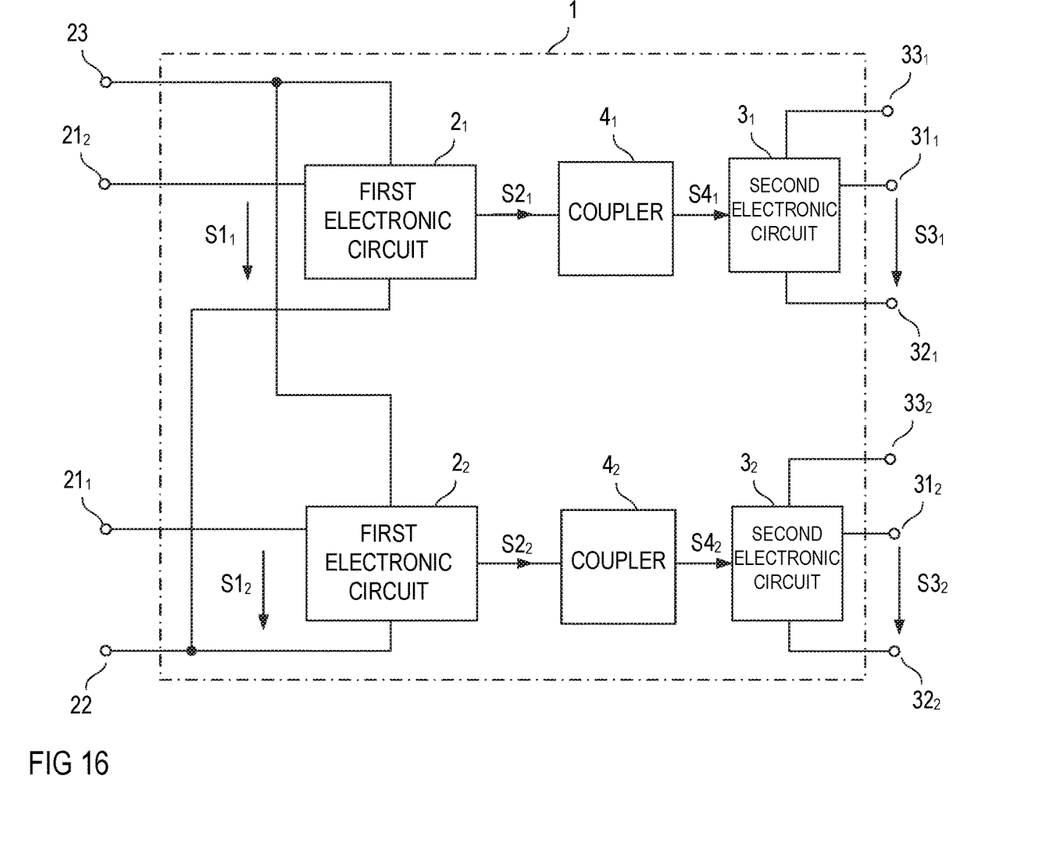
FIG. 16 shows one example of a circuit arrangement with two second electronic circuits.

The circuit arrangement of the type explained herein before is suitable to drive one transistor device. FIG. 16 shows a modification of the circuit arrangement, wherein the circuit arrangement shown in FIG. 16 is configured to drive two transistor devices. This circuit arrangement is based on the circuit arrangement explained herein before and includes two first electronic circuits $2_1$, $2_2$, two coupling circuits $4_1$, $4_2$ and two second electronic circuits $3_1$, $3_2$. Each of these second electronic circuits includes two output nodes $31_1$, $31_2$, $32_1$, $32_2$ and is configured to provide a drive signal $S3_1$, $S3_2$ to a respective one of the transistor devices based on a respective input signal $S1_1$, $S1_2$. Each of the first electronic circuits $2_1$, $2_2$ includes two first input nodes $21_1$, $21_2$ and a second input node 22, wherein the second input node 22 can be common to the two first electronic circuits $2_1$, $2_2$. Further, both first electronic circuits $2_1$, $2_2$ may receive the same supply voltage from the supply node 23.

Figure 17:
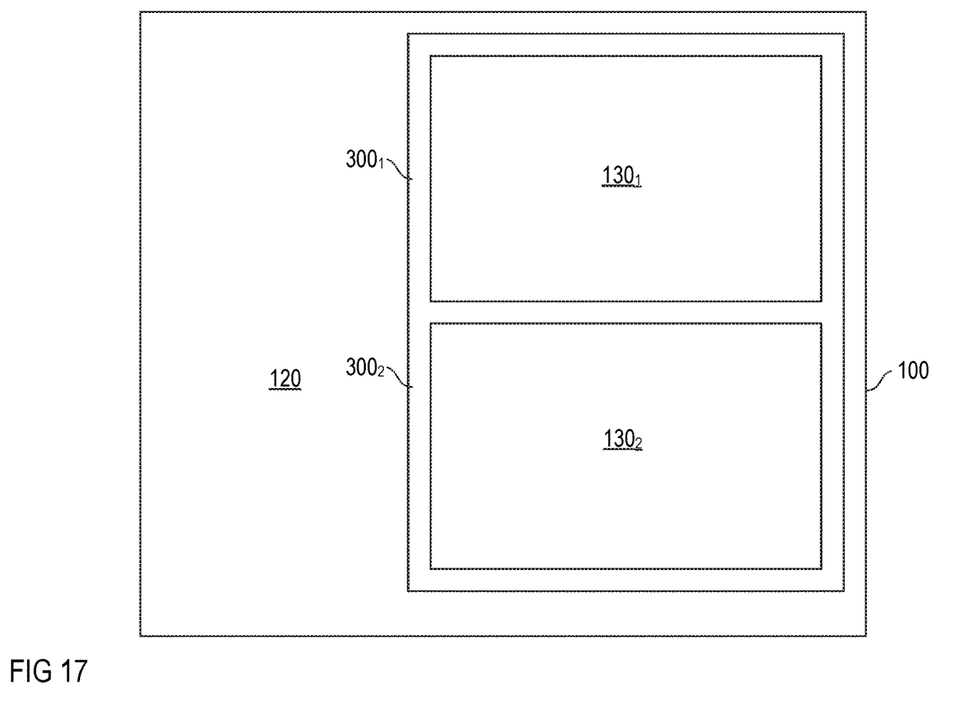
FIG. 17 illustrates a top view of a semiconductor layer in which a circuit arrangement of the type shown in FIG. 16 can be integrated.

FIG. 17 shows a top view of a semiconductor layer 100 in which the circuit arrangement of the type shown in FIG. 16 may be integrated. In this example, there are two second regions $130_1$, $130_2$, wherein each of these second regions $130_1$, $130_2$ is insulated from the first region 120 by a second insulating layer $300_1$, $300_2$. In each of these second regions $130_1$, $130_2$ one of the second electronic circuits $3_1$, $3_2$ are integrated. The first and second first electronic circuit $2_1$, $2_2$ can be integrated in the first region 120.

Although FIG. 16 shows a circuit arrangement configured to drive two transistor devices, this is only an example. According to another example, three, four or six transistor devices can be driven by the circuit arrangement. In this case, the circuit arrangement includes a corresponding number of first electronic circuits and second electronic circuits, wherein the first electronic circuits may be integrated in the same first region 120 of the semiconductor layer 100, while each of the output circuits is integrated in a respective second region, wherein the second regions are insulated from each other and from the first region by second insulating layers. In each case, a voltage blocking capability of the first insulating layer 200 may be lower than a voltage blocking capability of each of the second insulating layers $300_1$-$300_2$ and a voltage blocking capability of each of the coupling circuits $4_1$-$4_2$.

Figure 18:
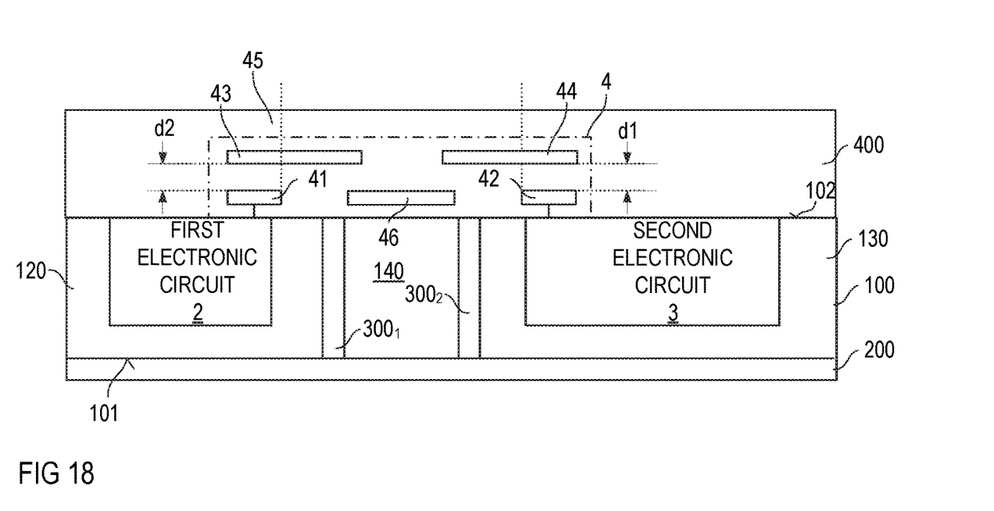
FIG. 18 illustrates a circuit arrangement with a coupling circuit according to a further example.

In the examples explained above, the coupling circuit 4 includes four capacitor plates 41-44, wherein a third and fourth capacitor plate 43, 44 of these capacitor plates 41-44 may be formed by one plate. FIG. 18 shows a coupling circuit 4 according to a further example. In this example, the third and fourth capacitor plate 43, 44 are separated and capacitively coupled with a further capacitor plate 46. This further capacitor plate 46 is arranged above a third region 140 and in the third insulation layer 400.

Figure 19:
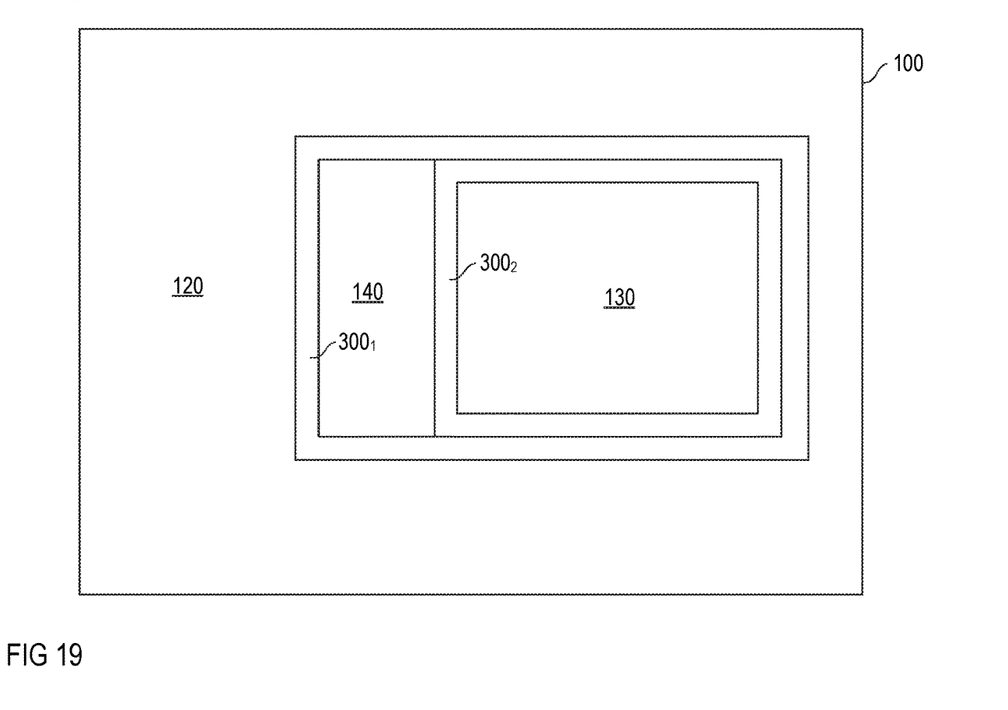
FIG. 19 schematically illustrates a top view of a semiconductor layer of the circuit arrangement shown in FIG. 18.

Referring to FIG. 19, which shows a top view of the semiconductor layer 100 shown in FIG. 18, the third region 140 is electrically insulated from the first region 120 by a first sub-layer $300_1$ of the second insulation layer 300 and is electrically insulated from the second region 130 by a second sub-layer $300_2$ of the second insulation layer 300. Further, the first region 120 is separated from the second region 130 by the first and second sub-layer $300_1$, $300_2$ or (not shown) by an insulation layer having a dielectric strength that at least equals the dielectric strength of the first sub-layer $300_1$ plus the dielectric strength of the second sub-layer $300_2$.

The further capacitor plate 46 may be implemented as a single capacitor plate (as illustrated) or may include two separate plate sections, a first plate section adjacent the third capacitor plate 43 and a second plate section adjacent the fourth capacitor plate 44, wherein the two plate sections (not shown in FIG. 18) are electrically connected in an arbitrary way.

The coupling circuit shown in FIG. 18 includes four capacitors connected in series, the first capacitor explained above that is formed by the first capacitor plate 41, the third capacitor plate 43 and a section of the third insulating layer 400 separating the first capacitor plate 41 from the third capacitor plate 43; the second capacitor explained above that is formed by the second capacitor plate 42, the fourth capacitor plate 44 and a section of the third insulating layer 400 separating the second capacitor plate 42 from the fourth capacitor plate 43; a third capacitor formed by the third capacitor plate 43, the further capacitor plate 46 and a section of the third insulating layer 400 separating the third capacitor plate 41 from the further capacitor plate 46; and a fourth capacitor formed by the further capacitor plate 46, the fourth capacitor plate 44 and a section of the third insulating layer 400 separating the further capacitor plate 46 from the fourth capacitor plate 44. The third capacitor is connected between the first capacitor and the fourth capacitor, and the fourth capacitor is connected between the third capacitor and the second capacitor.

According to one example, a horizontal distance between the first capacitor plate 41 and the further capacitor plate 46 is greater than the sum of a vertical distance between the first capacitor plate 41 and the third capacitor plate 43 and a vertical distance between the third capacitor plate 43 and the further capacitor plate 46, a horizontal distance between the third capacitor plate 43 and the fourth capacitor plate 44 is greater than the sum of a vertical distance between the third capacitor plate 43 and the further capacitor plate 46 and a vertical distance between the further capacitor plate 46 and the fourth capacitor plate 44, and a horizontal distance between the further capacitor plate 46 and the second capacitor plate 42 is greater than the sum of a vertical distance between the further capacitor plate 46 and the fourth capacitor plate 44 and a vertical distance between the fourth capacitor plate 44 and the second capacitor plate 42. In this case, the voltage blocking capability of the coupling circuit 4 is essentially given by the sum of the voltage blocking capabilities of the first, second, third, and fourth capacitor, wherein a voltage blocking capability of a single one of these capacitors is dependent on vertical distance of the capacitor plates of the respective capacitor.

The voltage blocking capability of the coupling circuit 4 can further be increased (when using the same material of the third insulating layer 400 and the same vertical distances between individual capacitor plates) by providing more than one further capacitor plates. An example of a coupling circuit 4 with three further capacitor plates $46_1$, $46_2$, $46_3$ is illustrated in FIG. 20, a top view of the semiconductor body 100 shown in FIG. 20 is shown in FIG. 21.

Figure 20:
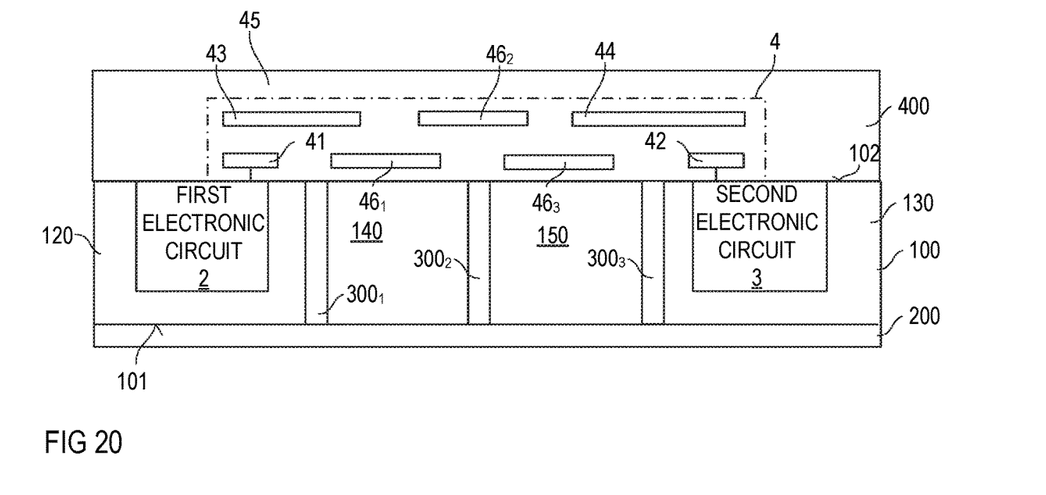
FIG. 20 illustrates a modification of the circuit arrangement shown in FIG. 18.

In the example shown in FIG. 20, the third and fourth capacitor plate 43, 44 are separated. The third capacitor plate 43 is capacitively coupled with a first further capacitor plate $46_1$, the first further capacitor plate $46_1$ is capacitively coupled with a second further capacitor plate $46_2$, the second further capacitor plate $46_2$ is capacitively coupled with a third further capacitor plate $46_3$, and the third further capacitor plate $46_3$ is capacitively coupled with the fourth capacitor plate. In this way, six series connected capacitors are formed. The first further capacitor plate $46_1$ is arranged above the third region 140 and in the third insulation layer 400, the third further capacitor plate 463 is arranged above a fourth region 150 and in the third insulation layer 400, and the second further capacitor plate $46_2$ is arranged in the third insulation layer 400 and spaced apart from each of the first further capacitor plate $46_1$ and the third further capacitor plate $46_3$ in the vertical direction.

Figure 21:
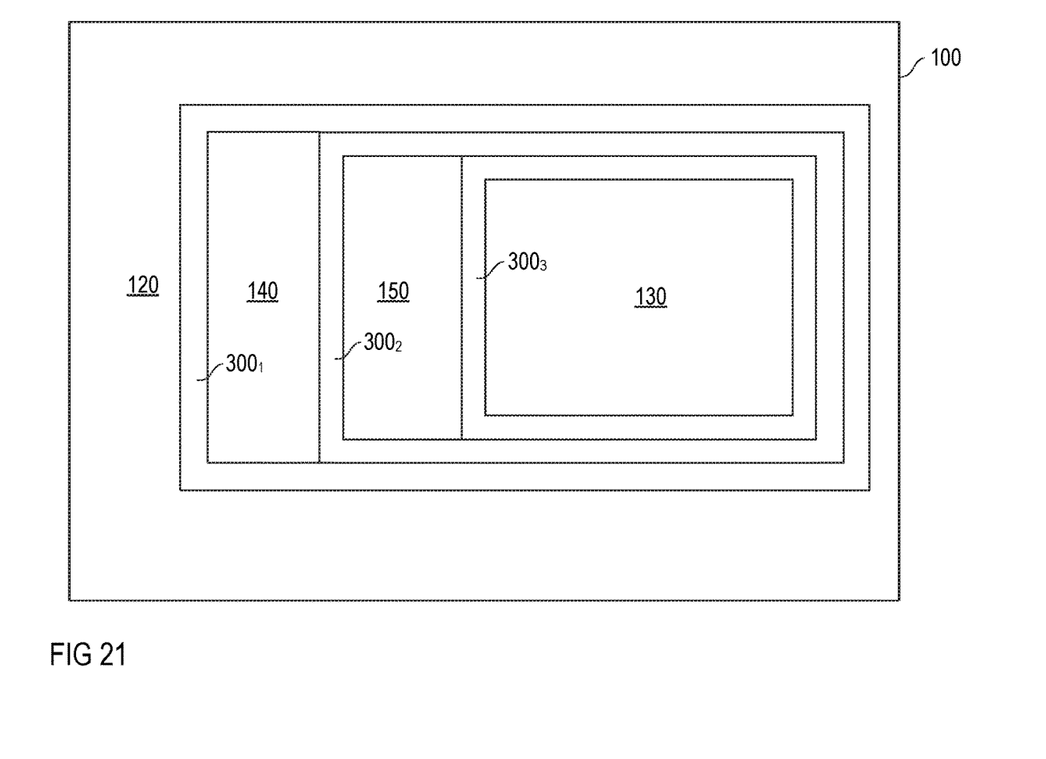
FIG. 21 schematically illustrates a top view of a semiconductor layer of the circuit arrangement shown in FIG. 20.

FIG. 21, the third region 140 is electrically insulated from the first region 120 by a first sub-layer $300_1$ of the second insulation layer 300 and is electrically insulated from the fourth region 150 by a second sub-layer $300_2$ of the second insulation layer 300, and the fourth region 150 is electrically insulated from the second region 130 by a third sub-layer $300_3$ of the second insulation layer 300. Further, the first region 120 is separated from the fourth region 150 by the first and second sub-layer $300_1$, $300_2$ or (not shown) by an insulation layer having a dielectric strength that at least equals the dielectric strength of the first sub-layer $300_1$ plus the dielectric strength of the second sub-layer $300_2$. Further, the first region 120 is separated from the second region 150 by the first, second and third sub-layer $300_1$, $300_2$, $300_3$ or (not shown) by an insulation layer having a dielectric strength that at least equals the dielectric strength of the first sub-layer $300_1$ plus the dielectric strength of the second sub-layer $300_2$ plus the dielectric strength of the third sub-layer $300_3$.

Each of the further capacitor plates $46_1$, $46_2$, $46_3$ may be implemented as a single capacitor plate (as illustrated) or may include two separate plate sections as explained above with reference to the further capacitor plate shown in FIG. 18.

In the coupling circuit illustrated in FIG. 4, the third capacitor plate 43 is electrically connected with the fourth capacitor plate 44. In the coupling circuits shown in FIGS. 18 and 20, the third capacitor plate 43 is electrically connected with the fourth capacitor plate 44 via at least one further capacitor plate, one further capacitor plate 46 in the example shown in FIG. 18, and three further capacitor plates $46_1$, $46_2$, $46_3$ in the example shown in FIG. 20.

What is claimed is:

1. A circuit arrangement, comprising:
   a first electronic circuit;
   a second electronic circuit; and
   a coupling circuit connected between the first electronic circuit and the second electronic circuit,
   wherein the first electronic circuit is at least partially integrated in a first region of a semiconductor layer,
   wherein the second electronic circuit is at least partially integrated in a second region of the semiconductor layer,
   wherein the second region adjoins a first insulating layer formed on a first surface of the semiconductor layer and is electrically insulated from the first region by a second insulating layer, and
   wherein the coupling circuit is arranged in a third insulating layer formed on a second surface of the semiconductor layer and comprises at least two capacitors connected in series.

2. The circuit arrangement of claim 1,
   wherein a voltage blocking capability of the first insulating layer is lower than a voltage blocking capability of the second insulating layer and a voltage blocking capability of the coupling circuit.

3. The circuit arrangement of claim 1, further comprising:
a first port connected to the first electronic circuit; and
a second port connected to the second electronic circuit.

4. The circuit arrangement of claim 3, further comprising:
an electrically conducting carrier mounted to the first insulating layer.

5. The circuit arrangement of claim 4,
wherein the first port comprises a first node and a second node, and
wherein the electrically conducting carrier is electrically connected to the first electronic circuit and forms the second node.

6. The circuit arrangement of claim 4, further comprising:
a housing enclosing the first electronic circuit, the second electronic circuit, and the coupling circuit, and at least partially enclosing the electrically conducting carrier.

7. The circuit arrangement of claim 1, wherein the coupling circuit comprises:
a first capacitor plate connected to the first electronic circuit;
a second capacitor plate connected to the second electronic circuit and spaced apart from the first capacitor plate in a first horizontal direction of the third insulating layer;
a third capacitor plate spaced apart from the first capacitor plate in a vertical direction of the third insulating layer; and
a fourth capacitor plate spaced apart from the second capacitor plate in the vertical direction of the third insulating layer.

8. The circuit arrangement of claim 7, wherein the third capacitor plate and the fourth capacitor plate are electrically connected.

9. The circuit arrangement of claim 8, wherein the third capacitor plate and the fourth capacitor plate are formed by one electrically conducting plate.

10. The circuit arrangement of claim 7,
wherein the third capacitor plate and the fourth capacitor plate are capacitively coupled via at least one further capacitor plate,
wherein the at least one further capacitor plate is arranged above a semiconductor region that is insulated from the first region and the second region.

11. The circuit arrangement of claim 1, wherein the second insulating layer extends through the semiconductor layer in a vertical direction.

12. The circuit arrangement of claim 11, wherein the second insulating layer comprises a plurality of via sections each extending through the semiconductor layer in the vertical direction of the semiconductor layer and spaced apart from each other in horizontal directions.

13. A circuit arrangement, comprising:
an electrically conducting carrier;
a semiconductor layer mounted on the electrically conducting carrier;
a first electronic circuit at least partially integrated in a first region of the semiconductor layer;
a second electronic circuit at least partially integrated in a second region of the semiconductor layer, wherein the second region adjoins a first insulating layer formed on a first surface of the semiconductor layer and is electrically insulated from the first region by a second insulating layer;
a coupling circuit connected between the first electronic circuit and the second electronic circuit, wherein the coupling circuit is arranged in a third insulating layer formed on a second surface of the semiconductor layer; and
a housing that encapsulates the semiconductor layer, the first electronic circuit, the second electronic circuit, and the coupling circuit.

14. The circuit arrangement of claim 13, wherein a voltage blocking capability of the first insulating layer is lower than a voltage blocking capability of the second insulating layer and a voltage blocking capability of the coupling circuit.

15. The circuit arrangement of claim 13, further comprising:
a first port connected to the first electronic circuit; and
a second port connected to the second electronic circuit.

16. The circuit arrangement of claim 13, wherein the coupling circuit comprises:
a first capacitor plate connected to the first electronic circuit;
a second capacitor plate connected to the second electronic circuit and spaced apart from the first capacitor plate in a first horizontal direction of the third insulating layer;
a third capacitor plate spaced apart from the first capacitor plate in a vertical direction of the third insulating layer; and
a fourth capacitor plate spaced apart from the second capacitor plate in the vertical direction of the third insulating layer.

17. The circuit arrangement of claim 16, wherein the third capacitor plate and the fourth capacitor plate are electrically connected.

18. The circuit arrangement of claim 16, wherein the third capacitor plate and the fourth capacitor plate are formed by one electrically conducting plate.

19. The circuit arrangement of claim 13, wherein the housing includes a molding compound based on an epoxy resin.

20. The circuit arrangement of claim 13, further comprising a plurality of legs protruding from the housing and electrically connecting to a plurality of contact pads on a surface of the third insulating layer.

* * * * *